(12) United States Patent
Andersson

(10) Patent No.: US 6,208,199 B1
(45) Date of Patent: Mar. 27, 2001

(54) PULSE AMPLIFIER WITH LOW DUTY CYCLE ERRORS

(75) Inventor: Bengt-Olov Andersson, Järfälla (SE)

(73) Assignee: Mitel Semiconductor AB (SE)

( * ) Notice: Subject to any disclaimer, the term of this patent is extended or adjusted under 35 U.S.C. 154(b) by 0 days.

(21) Appl. No.: 09/270,776

(22) Filed: Mar. 17, 1999

Related U.S. Application Data

(60) Provisional application No. 60/079,668, filed on Mar. 27, 1998.

(30) Foreign Application Priority Data

Mar. 30, 1998 (CA) .................................................. 2233527

(51) Int. Cl.⁷ ...................................................... H03K 5/08
(52) U.S. Cl. ......................... 327/561; 327/262; 327/558; 327/174; 327/180; 330/10; 330/260
(58) Field of Search ..................................... 327/174, 560, 327/307, 561, 563, 327, 262, 558, 180; 330/260, 263, 265, 10

(56) References Cited

U.S. PATENT DOCUMENTS 3,772,604 * 11/1973 Hogg et al. ........................... 327/180
5,469,097 * 11/1995 Ho ......................................... 327/170
5,512,848    4/1996 Yaklin .................................. 327/307
6,054,886 * 4/2000 Opris et al. ........................... 327/304

FOREIGN PATENT DOCUMENTS

| 0 358 518 A1 | 3/1990 | (EP) . |
| 0 451 378 A1 | 10/1991 | (EP) . |
| 2258779 | 2/1993 | (GB) . |
| WO 95/22202 A1 | 8/1995 | (WO) . |
| WO 95/22206 A1 | 8/1995 | (WO) . |

* cited by examiner

Primary Examiner—Dinh T. Le
(74) Attorney, Agent, or Firm—Laubscher & Laubscher

(57) ABSTRACT

A low power pulse amplifier with low duty cycle errors. The amplifier provides several differential amplifier stages with a biasing and canceling network. To minimize duty cycle errors for large input signals, cascode transistors are added between the drains of the differential amplifiers and the outputs. The result is an amplifier having a duty cycle error of less than 5% at amplitude input ranges from 5 millivolts to the supply voltage.

25 Claims, 2 Drawing Sheets

PULSE AMPLIFIER WITH LOW DUTY CYCLE ERRORS

CROSS REFERENCE TO RELATED APPLICATION

This invention claims priority under 35 USC 119 (e) from provisional application Ser. No. 60/079,668 filed on Mar. 27, 1998.

FIELD OF THE INVENTION

The present invention relates to a low power pulse amplifier, and more particularly to a low power pulse amplifier with a low duty cycle error at high input levels.

BACKGROUND OF THE INVENTION

The duty cycle requirements for pulse amplifiers of this type excludes the use of single-ended amplifiers since clipping at higher amplitudes results in different clip levels and delays in the positive and negative directions.

Typically, for a single-ended input signal, an ordinary differential stage consisting of a differential pair of transistors produces asymmetrical delays in the positive and negative directions of the input signal if the input signal is large. The main reason for this is that the common source node for the differential pair will change its potential differently between large positive and large negative input signals.

When the input signal turns off the input transistor, the voltage of the common source node only changes a small amount due to the doubled current in the other transistor. In the other direction the common source node shorts to the output node and changes a substantial amount. One solution to this problem is to reduce the absolute delay times by increasing bandwidth. But this solution comes at the expense of increased current consumption.

An object of the present invention is to provide an improved pulse amplifier.

SUMMARY OF THE INVENTION

According to the present invention there is provided a pulse amplifier comprising an input for receiving input signals, an output, and a plurality of fully differential amplifier stages between said input and output arranged to ensure more symmetrical delays in positive and negative directions of the input signals.

In accordance with the invention fully differential gain stages, that is differential amplifiers with differential inputs and differential outputs, give more symmetrical delays and reduce the problem.

In a preferred embodiment, each fully differential amplifier stage comprises first and second transistors forming a differential pair and having a common node, a pair of load transistors in parallel with the respective first and second transistors, and a limiting circuit for limiting the voltage swing of the common node to a substantially constant voltage for large input signals. It is however possible to place the load transistors in series with the transistors of the differential pair.

The invention also preferably includes a biasing network and an offset canceling network.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 1:
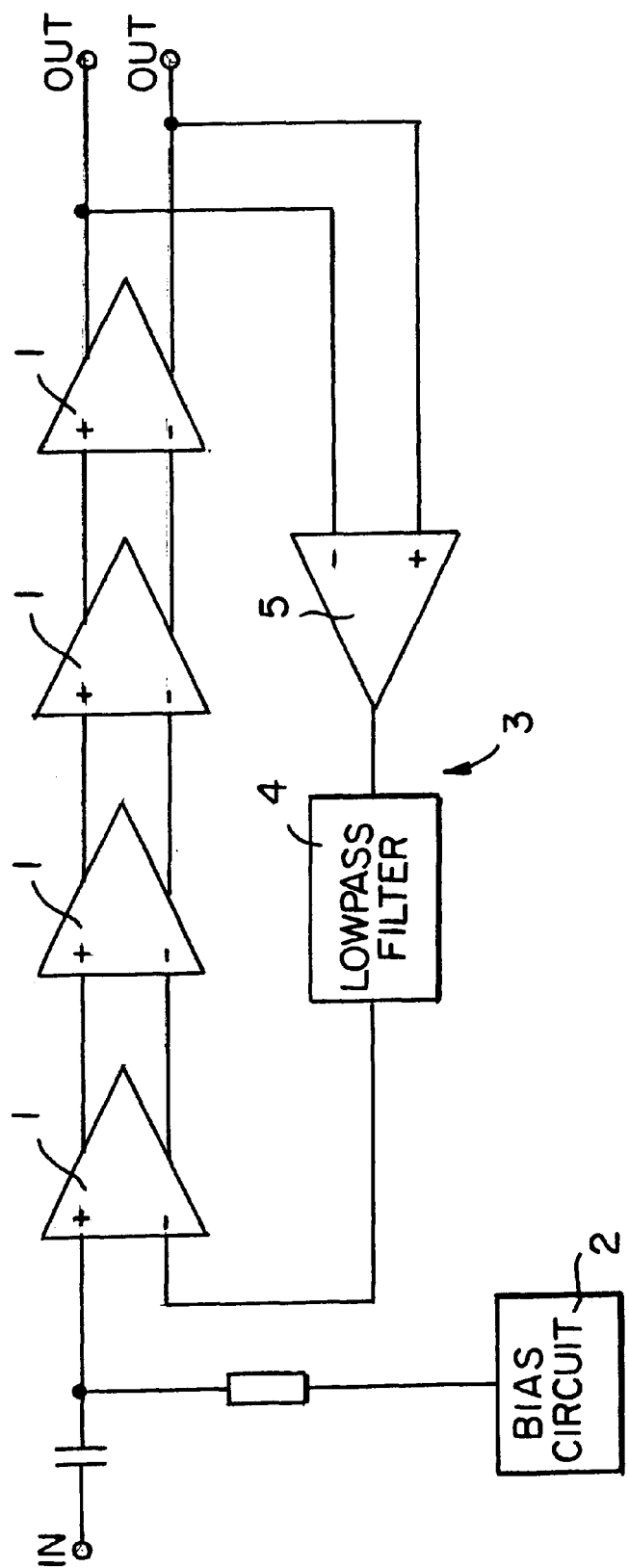
FIG. 1 is a block diagram of a multistage pulse amplifier with a low duty cycle.

The pulse amplifier with low duty cycle shown in FIG. 1 consists of several cascaded fully differential, i.e. differential in/differential out, amplifier stages 1, a biasing network 2, and an offset canceling network 3 consisting of a low pass filter 4 and an ordinary differential amplifier 5. The gain of the amplifier 5 and the cut-off frequency of the low pass filter 4 in the offset canceling network should be chosen so that the resulting high pass characteristic of the canceling network has a cut-off frequency below the frequencies contained in the input signal applied to the amplifier.

Figure 2:
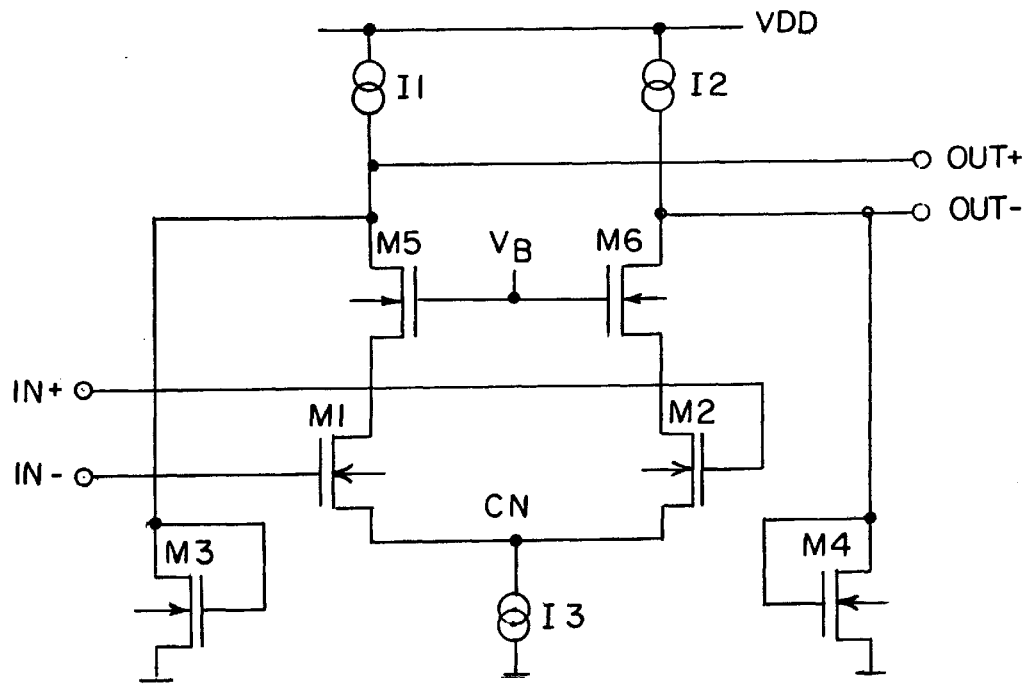
FIG. 2 is a schematic illustration of an amplifier stage with an NMOS input.

FIG. 2 illustrates an amplifier stage 1 with a NMOS input, although it will be understood that the amplifier can be configured in opposite logic using PMOS components.

Differential input signals IN+, IN−, are applied to respective NMOS transistors M1, M2 having a common node CN and together forming a differential pair. Transistors M1, M2 are in series with respective cascode transistors M5, M6 providing respective differential outputs OUT+, OUT−. Current sources $I_1$, $I_2$ for the differential pair are connected to supply rail $V_{DD}$.

Load transistors M3 and M4 are connected in parallel with respective series combinations M1, M5 and M2, M6 to the same supply $V_{DD}$ as the current sources $I_1$, $I_2$ for the differential pair M1, M2 in order to minimize the supply voltage needed to drive the amplifier. The two matching current sources $I_1$ and $I_2$ are larger than current source $I_3$ connected to common node CN to guarantee that there is always a current flowing through M3 and M4 even when the differential stage is fully saturated. This reduces the output voltage swing during clipping.

It is possible to place the load transistors M3 and M4 in series with the with respective series combinations M1, M5 and M2, M6, in which case the current sources should be placed where the respective load transistors are located in the parallel configuration.

The two cascode transistors M5 and M6, which are provided between the drains of the differential pair and the two outputs OUT+, OUT−, minimize duty cycle errors for large input signals. The gate voltage to the cascode transistors is chosen to set the Vds of the differential pair above, but not substantially above, the saturation voltage of these transistors. The holds true as long as the amplifier circuit is not clipping due to large input signals.

The cascode transistors ultimately turn off if a large input signal charges the common source node of the differential pair toward the output dc level so this node will be held relatively constant for very large input signals resulting in significantly more symmetric delays in positive and negative directions.

In the presence of large input signals, one of the transistors of the differential pair, say M1, is driven hard into conduction, and its drain in effect gradually becomes shorted to the common node. The drain of transistor M1 is connected to the source of transistor M5, and consequently the voltage of the source of cascode transistor M5 approaches the voltage of its gate, so that the current flow through transistor M5 gradually reduces until it eventually turns off. This of course has the effect of gradually reducing the current flow through the associated differential transistor M1.

In a typical design the common node with change 75 mV to 150 Mv before the limiting circuit is activated.

The gain is set by the ratio of transconductance in M1 and M3. It is advantageous to use the same type of transistors in both the differential pair and the load to minimize the gain variations due to process spread and the threshold voltage variations. In all normal cases the gain is larger than one, so M3 will have a lower transconductance than M1. With $I_1$ and $I_2$ being than $I_3$, the dc current in the load transistors M3 and M4 will be larger than in M1 and M2, so W/L for M3 and M4 has to be smaller than in M1 and M2 to move them deeper into strong inversion and lower the transconductance. This results in a larger Vgs for the load transistors than for the differential pair, so there will be enough voltage over the current source for the differential pair to function correctly if the input of one gain stage is dc coupled to the output of the previous stage.

The bias network generates the bias voltages for the current sources and the cascode transistors. With an ac coupled signal, the bias network also supplies the dc bias for the input node. In cases where the amplifier is powered on and off, the start-up time can be reduced if the offset cancellation feedback signal is held at a voltage near the dc input voltage while the amplifier is disabled.

The current sources $I_1$ to $I_3$ can be implemented as simple current mirrors or cascoded current mirrors if better PSRR (Power Supply Rejection Ratio) is required.

In an alternative embodiment, if, for instance, the gain is low or the output is ac coupled, the offset voltage at the output may be acceptable without offset cancellation. In this case the reference input is connected to a fixed voltage instead, typically the same voltage biasing the signal input.

The circuit can be turned inverted with all NMOS transistors replaced by PMOS transistors and vice versa.

The amplifiers can also be made variable gain amplifiers if the current source $I_3$ is made variable. A lower $I_3$ current will reduce the transconductance in the differential pair and also increase the current in the load transistors and increase their transconductance.

With differential input signals, the cascode transistors may not be needed and can be removed to save space. Even in an amplifier with a single ended input this is true in all but the first stage.

Figure 3:
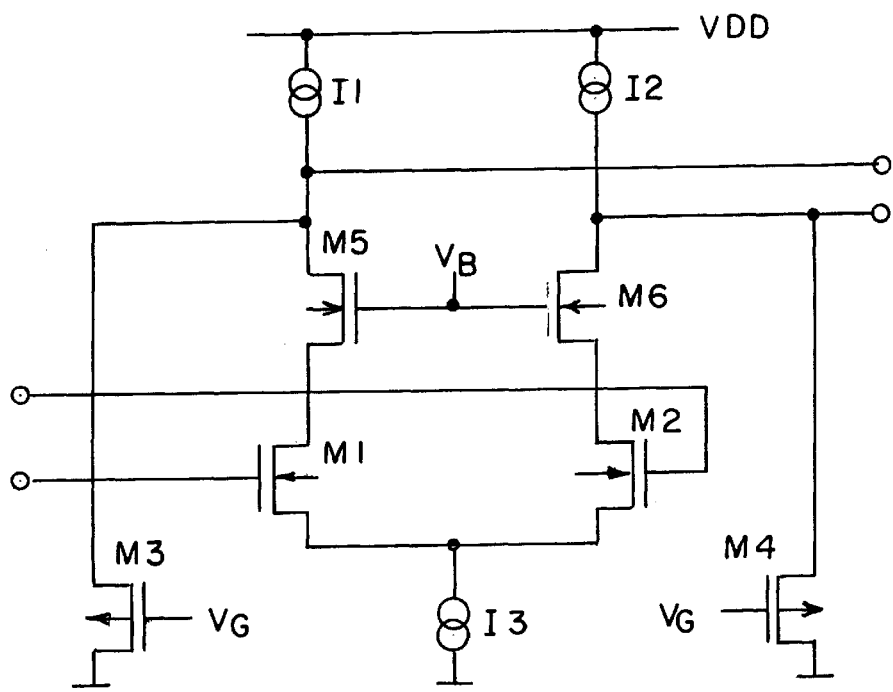
FIG. 3 is a schematic illustration of an alternative embodiment of the amplifier stage.

If the dc level at the outputs of the amplifier stage must be set at a different voltage than slightly above the NMOS threshold, the NMOS load transistors M3, M4 can be replaced by PMOS transistors with their sources tied to their outputs, the drains to Vss and their gates to a voltage $V_G$, which is approximately the desired output voltage minus a PMOS threshold voltage. This arrangement is shown in FIG. 3. The drawback with this solution is a larger parameter variation due to process spread.

The pulse amplifier is general in nature and can be used in a wide range of applications. Signals should be ac coupled since the input common mode range is limited. In particular, it can amplify a Manchester coded data stream at 300 kbits/sec. The amplitude ranges from 5 mV pp up to the supply voltage and maintains a duty cycle error of less than 5%.

Advantages of the amplifier according to the present invention thus include:

low duty cycle errors at high input levels due to well controlled clipping;

low voltage operation by connecting the gain transistor and load transistor to the same supply rail; and the gain is relatively insensitive to temperature and process variations by the use of the same type of transistor as gain element and load.

As mentioned above, the load transistors M3 and M4 can be placed in series with the cascode transistors M5, M6, in which case they change places with the current sources $I_1$, $I_2$.

Although embodiments of the invention have been described above, it is not limited thereto and it will be apparent to those skilled in the art that numerous modifications form part of the present invention insofar as they do not depart from the spirit, nature and scope of the claimed and described invention.

I claim:

1. A pulse amplifier comprising a first input for receiving an input signal containing frequencies, a feedback input, an output, a plurality of fully differential amplifier stages between said inputs and said output, and an offset canceling feedback network between said output and said feedback input comprising an amplifier and a low pass filter having a cut-off frequency below said frequencies contained in said input signal.

2. A pulse amplifier as claimed in claim 1, wherein each fully differential amplifier stage comprises first and second transistors forming a differential pair and having a common node, and a pair of load transistors for said respective first and second transistors.

3. A pulse amplifier as claimed in claim 2, wherein at least one of said stages comprises a limiting circuit for limiting a voltage swing of said common node thereof.

4. A pulse amplifier as claimed in claim 3, wherein in the presence of large input signals causing one of said first and second transistors to be driven hard into conduction, said limiting circuit reduces current flow through said conducting one of said first and second transistors.

5. A pulse amplifier as claimed in claim 4, wherein said limiting circuit comprises cascode transistors in series with said respective first and second transistors, whereby in the presence of large input signals, the current flow through the cascode transistor in series with said conducting one of said first and second transistors is reduced.

6. A pulse amplifier as claimed in claim 5, wherein said transistors are field effect transistors.

7. A pulse amplifier as claimed in claim 6, wherein said field effect transistors transistors have first and second main electrodes, and a gate electrode, and the second main electrodes of said first and second transistors are connected to the first main electrodes of said respective cascode transistors, and wherein in the presence of large input signals, said common node is substantially shorted to the first main electrode of said cascode transistor which is connected to the second main electrode of said one conducting transistor, and said current through said cascode transistor in series with said conducting one transistor is gradually reduced as the voltage of the first main electrode thereof approaches the gate voltage voltage thereof.

8. A pulse amplifier as claimed in claim 7, wherein said first and second transistors each have a saturation voltage, and said cascode transistors hold a voltage between said first main electrode and said second main electrode of each of said first and second transistors substantially constant above said saturation voltage for each of said first and second transistors as long as the amplifier stage is not clipping due to large input signals.

9. A pulse amplifier as claimed in claim 8, wherein said first main electrode is the source, and said second main electrode is the drain.

10. A pulse amplifier as claimed in claim 8, wherein said load transistors are in parallel with said first and second transistors.

11. A pulse amplifier as claimed in claim 10, further comprising first and second respective current sources in series with said cascode transistors, and a third current source in series with said common node.

12. A pulse amplifier as claimed in claim 11, wherein said first and second current sources provide a current larger than a current provided by said third current source to ensure that current flows through said load transistors even when said first and second transistors are saturated.

13. A pulse amplifier as claimed in claim 11, further comprising a biasing network for generating bias voltages for said current sources and said cascode transistors.

14. A pulse amplifier as claimed in claim 13, wherein the load transistors are of the same type as said differential transistors.

15. A pulse amplifier as claimed in claim 11, wherein said third current source is variable to provide said amplifier stages with variable gain.

16. A method of amplifying signal pulses containing frequencies, comprising the steps of passing said signal pulses through a succession of fully differential amplifier stages, and providing a feedback signal for said amplifier stages from an offset canceling network comprising an amplifier and a low pass filter having a cut-off frequency below said frequencies contained in said input signal.

17. A method as claimed in claim 16, wherein said amplifier stages comprise first and second transistors forming a differential pair connected to a common node, and a pair of load transistors for said respective first and second transistors, one of said first and second transistors being driven hard into conduction in the presence of large input signals, and current flow through conducting one of said first and second transistors is reduced for large input signals.

18. A method as claimed in claim 17, wherein said load transistors are arranged in parallel with said respective first and second transistors.

19. A method as claimed in claim 18, wherein said first and second transistors and said load transistors are connected to a common supply rail.

20. A method as claimed in claim 18, wherein a pair of cascode transistors are connected in series with said respective first and second transistors, first and second respective current sources are connected in series with said cascode transistors, and a third current source in series with said common node, said first and second current sources supplying a greater current than said third current source to ensure that current flows through said load transistors when said first and second transistors are saturated.

21. A method as claimed in claim 20, wherein an offset cancellation feedback signal is fed back to the input.

22. A method as claimed in claim 21, wherein when the amplifier is powered on, the offset cancellation feedback signal is held at a voltage near the dc input voltage while the amplifier is disabled to reduce start-up time.

23. A pulse amplifier comprising a first input for receiving an input signal containing frequencies, a feedback input, an output, a plurality of fully differential amplifier stages between said inputs and said output, each fully differential amplifier stage comprising first and second transistors forming a differential pair and having a common node, a pair of load transistors for said respective first and second transistors, and first and said cascode transistors in series with said first and second transistors for reducing the current through one of said first and second transistors driven into conduction in the presence of large input signals to limit the voltage swing of said common node, and an offset canceling feedback network between said output and said feedback input comprising an amplifier and a low pass filter having a cut-off frequency below said frequencies contained in said input signal.

24. A pulse amplifier as claimed in claim 23, wherein said load transistors are in parallel with said transistors of said differential pair.

25. A pulse amplifier comprising a first input for receiving an input signal containing frequencies, a feedback input, an output, a plurality of fully differential amplifier stages between said inputs and said output arranged to ensure more symmetrical delays in positive and negative directions of the input signals, each fully differential amplifier stage comprising first and second transistors forming a differential pair and having a common node, a pair of load transistors in parallel with said respective first and second transistors, and an offset canceling feedback network between said output and said feedback input comprising an amplifier and a low pass filter having a cut-off frequency below said frequencies contained in said input signal.

* * * * *